United States Patent
Kwon et al.

(10) Patent No.: US 7,387,930 B2
(45) Date of Patent: *Jun. 17, 2008

(54) METHOD OF FABRICATING A BOTTLE TRENCH AND A BOTTLE TRENCH CAPACITOR

(75) Inventors: Oh-Jung Kwon, Hopewell Junction, NY (US); Kenneth T. Settlemyer, Jr., Poughquag, NY (US); Ravikumar Ramachandran, Pleasantville, NY (US); Min-Soo Kim, Sandston, VA (US)

(73) Assignees: International Business Machines Corporation, Armonk, NY (US); Infineon Technologies North America Corp., San Jose, CA (US); Infineon Technologies AG, Munich (DE)

( * ) Notice: Subject to any disclaimer, the term of this patent is extended or adjusted under 35 U.S.C. 154(b) by 76 days.

This patent is subject to a terminal disclaimer.

(21) Appl. No.: 11/458,120

(22) Filed: Jul. 18, 2006

(65) Prior Publication Data

US 2006/0275974 A1    Dec. 7, 2006

Related U.S. Application Data

(62) Division of application No. 10/904,582, filed on Nov. 17, 2004, now Pat. No. 7,122,439.

(51) Int. Cl.
   *H01L 21/8242*    (2006.01)

(52) U.S. Cl. .............................. 438/243; 257/E27.092
(58) Field of Classification Search ........ 257/E27.092; 438/452, 243, 239
See application file for complete search history.

(56) References Cited

U.S. PATENT DOCUMENTS

| 5,658,816 | A | 8/1997 | Rajeevakumar | |
| 6,777,303 | B2 * | 8/2004 | Schrems et al. | 438/386 |
| 7,078,289 | B2 * | 7/2006 | Hsu | 438/243 |
| 7,122,437 | B2 * | 10/2006 | Dyer et al. | 438/386 |
| 7,122,439 | B2 * | 10/2006 | Kwon et al. | 438/386 |
| 2003/0036241 | A1 * | 2/2003 | Tews | 438/386 |
| 2005/0133846 | A1 * | 6/2005 | Dyer et al. | 257/303 |
| 2005/0164464 | A1 * | 7/2005 | Hecht et al. | 438/386 |

* cited by examiner

*Primary Examiner*—Thao P. Le
(74) *Attorney, Agent, or Firm*—Schmeiser, Olsen & Watts; Steven Capella

(57) ABSTRACT

A method of fabricating a bottle trench and a bottle trench capacitor. The method including: providing a substrate; forming a trench in the substrate, the trench having sidewalls and a bottom, the trench having an upper region adjacent to a top surface of the substrate and a lower region adjacent to the bottom of the trench; forming an oxidized layer of the substrate in the bottom region of the trench; and removing the oxidized layer of the substrate from the bottom region of the trench, a cross-sectional area of the lower region of the trench greater than a cross-sectional area of the upper region of the trench.

8 Claims, 15 Drawing Sheets

METHOD OF FABRICATING A BOTTLE TRENCH AND A BOTTLE TRENCH CAPACITOR

This Application is a division of U.S. patent application Ser. No. 10/904,582 filed on Nov. 17, 2004 now U.S. Pat. No. 7,122,439.

FIELD OF THE INVENTION

The present invention relates to the field of semiconductor device fabrication; more specifically, it relates to a method fabricating a bottle trench and a bottle trench capacitor.

BACKGROUND OF THE INVENTION

One use for trench capacitors is for the storage node of dynamic random access memory (DRAM) cells. As DRAM cell design rules become ever smaller, the required cell capacitance does not become smaller proportionally but remains relatively fixed. The use of bottle trench capacitors is one way of increasing the capacitance trench capacitors as the dimensions of DRAM cells decrease. However, present schemes for forming bottle trench capacitors suffer from etch related defects during formation of the bottle portion of the capacitor. These defects can cause shorting of the capacitor to the P-well of the DRAM cell and/or uneven capacitor dielectric formation. Further, poor bottle diameter size control due to non-uniform wet etch processes can lead to irregular bottle diameter, often resulting in merging of the bottles of adjacent DRAM cells. Merging of adjacent the bottles of adjacent trench capacitors can cause single bit fails in DRAM cell arrays. Defects and merged trenches can reduce DRAM processing yield, reliability and performance. Therefore, there is a need for a bottle trench capacitor process with reduced susceptibility to process defects and merging of adjacent trenches during formation of the bottle portion of the capacitor.

SUMMARY OF THE INVENTION

The present invention is directed to a method of forming an upper region of a trench (collar region of a bottle trench capacitor) and a wider lower region of the trench (bottle region of the bottle trench capacitor) by oxidation of sidewall and bottom surfaces of the lower portion of trench while protecting the upper region and removal of the oxidized layer thus formed.

A first aspect of the present invention is a method comprising: providing a substrate; forming a trench in the substrate, the trench having sidewalls and a bottom, the trench having an upper region adjacent to a top surface of the substrate and a lower region adjacent to the bottom of the trench; forming an oxidized layer of the substrate in the bottom region of the trench; and removing the oxidized layer of the substrate from the bottom region of the trench, a cross-sectional area of the lower region of the trench greater than a cross-sectional area of the upper region of the trench.

A second aspect of the present invention is a method, comprising: (a) providing a substrate; (b) forming a trench in the substrate, the trench having sidewalls and a bottom, the trench having an upper region adjacent to a top surface of the substrate and a lower region adjacent to the bottom of the trench, the upper region abutting the lower region; (c) forming a protective layer on the sidewalls and the bottom of the trench; (d) removing the protective layer from the sidewalls in the lower region of the trench and from the bottom of the trench; (e) oxidizing a layer of the substrate exposed in step (d) on the sidewalls in the lower region of the trench and on the bottom of the trench; and (f) removing the layer of the substrate oxidized in step (e) from the lower region of the trench.

A third aspect of the present invention is a method, comprising: (a) providing a substrate; (b) forming a trench in the substrate, the trench having sidewalls and a bottom; (c) forming a first silicon oxide layer on the sidewalls and the bottom of the trench, forming a silicon nitride layer on the silicon oxide layer and forming a polysilicon layer on the silicon nitride layer; (d) forming a second silicon oxide layer on the polysilicon layer, (e) partially filling the trench with an organic material, a top surface of the organic material defining a boundary between a lower region and an upper region the trench, the upper region adjacent to a top surface of the substrate and the lower region adjacent to the bottom of the trench; (f) removing the second silicon oxide layer in the upper region; (h) removing the organic material from the trench; (i) converting an outermost layer of the polysilicon layer in the upper region to a nitrided silicon layer; (j) removing in order the second silicon oxide layer, the polysilicon layer, the silicon nitride layer and the layer and the first silicon oxide layer from the lower region and the bottom of the trench; (k) forming an oxidized layer of the substrate on the sidewalls and the bottom of the trench exposed in step (j) in the lower region of the trench; and (l) removing the oxidized layer of the substrate from lower region of the trench.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
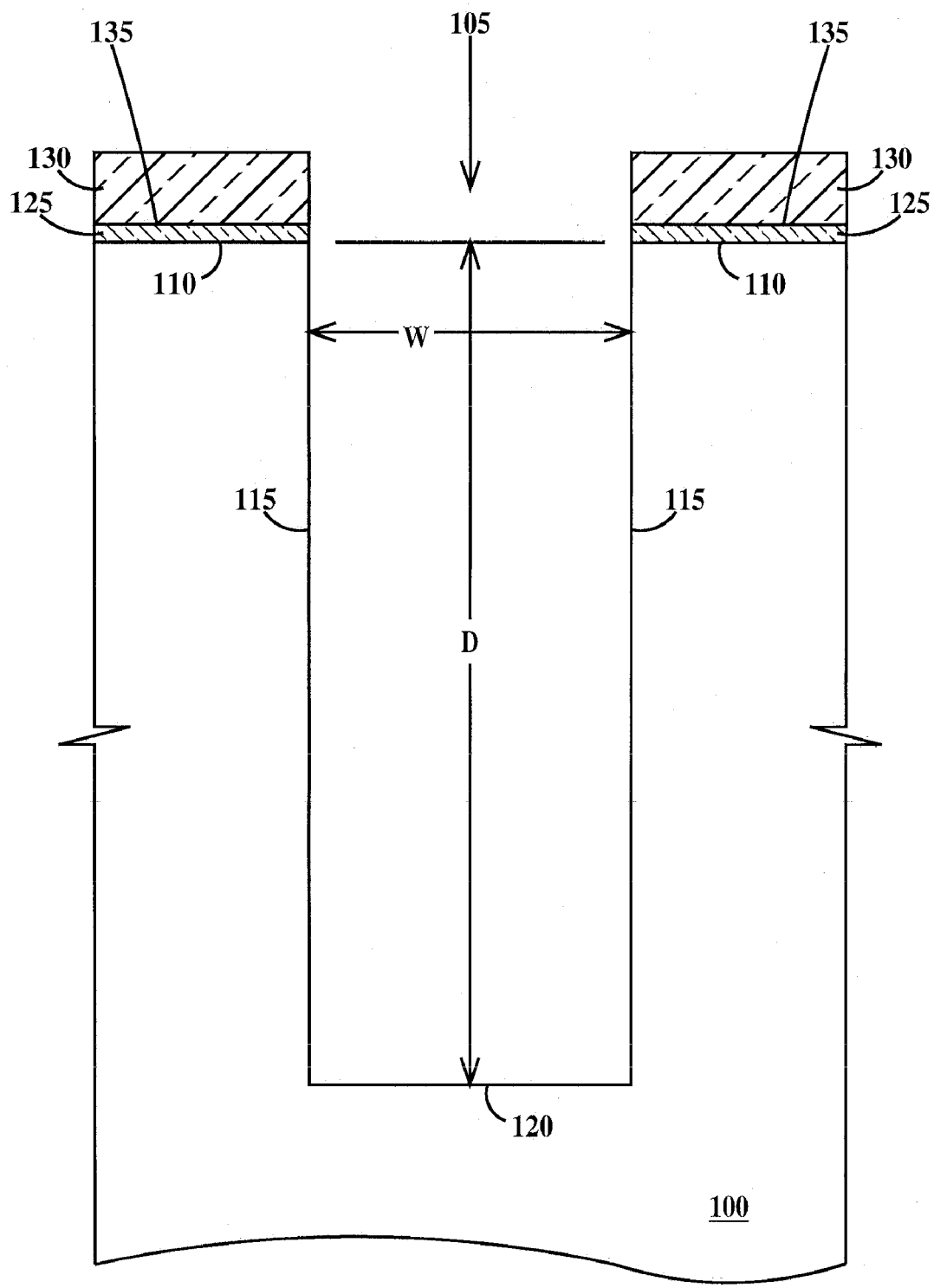
FIGS. 1 through 14 are partial cross-sectional views illustrating fabrication of a trench capacitor according to the present invention is according to the present invention.
Figure 2:
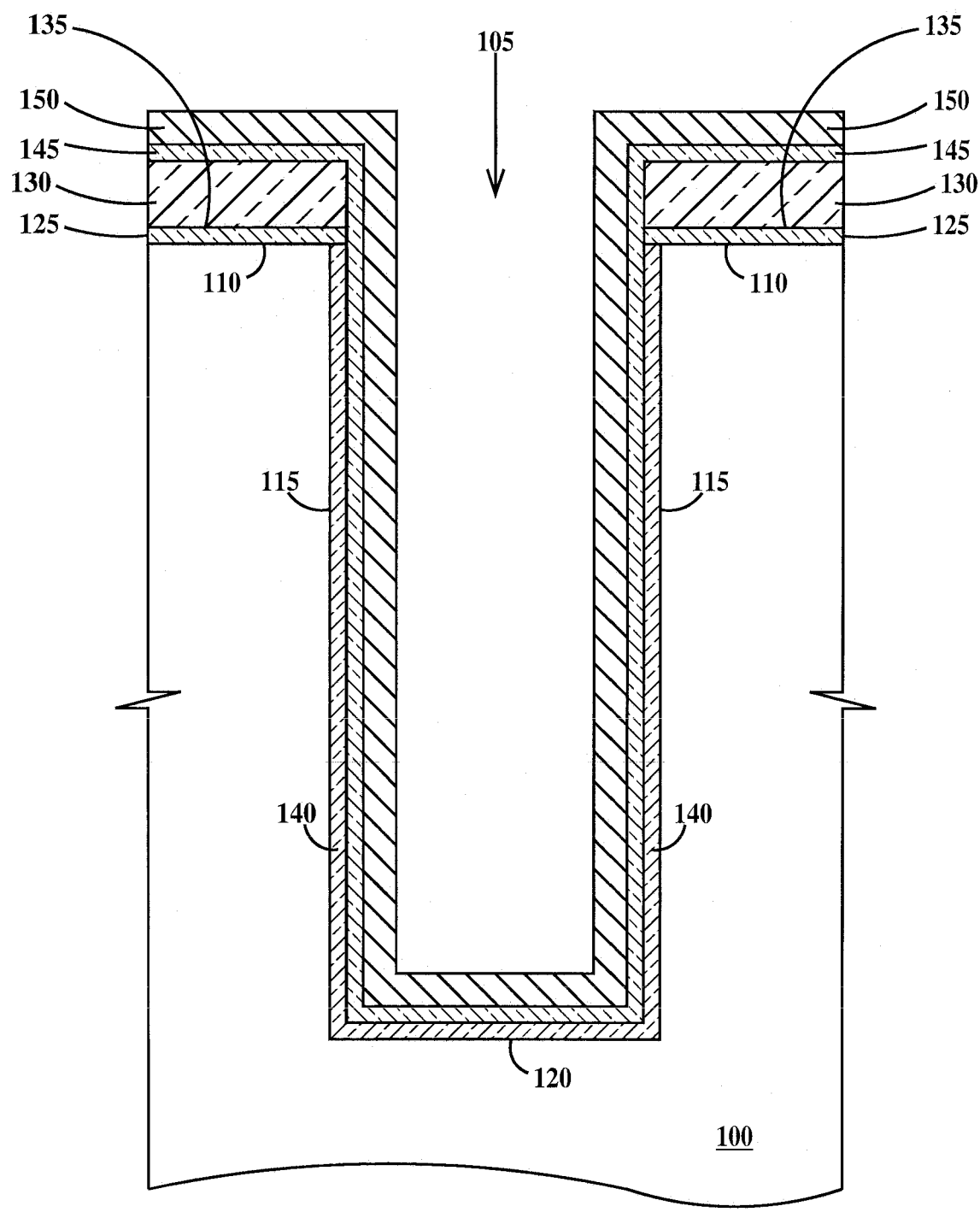

FIGS. 1 through 15 are partial cross-sectional views illustrating fabrication of a trench capacitor according to the present invention is according to the present invention. In FIG. 1, formed in a substrate 100 is a trench 105. Substrate 100 may be a bulk silicon substrate or a silicon-on-insulator (SOI) substrate. Substrate 100 may include an uppermost epitaxial silicon layer. For the purposes of the present invention, a silicon substrate is defined as a bulk silicon substrate, the silicon layer of a SOI substrate, an uppermost epitaxial silicon layer formed on either a bulk or SOI substrate or a silicon layer formed on a substrate of any other material. Trench 105 may be formed by any number of anistropic etch processes, such as plasma etching and reactive ion etching (RIE), known in the art using a hard mask that is lithographically defined. A top surface 110 of substrate 100 defines a horizontal or lateral direction and a vertical direction is defined as a direction perpendicular to the horizontal direction. Trench 105 includes sidewalls 115 and a bottom 120. In FIG. 1, the hard mask used to define trench 105 includes a pad oxide layer 125 formed on top surface 110 of substrate 100 and a pad nitride layer 130 formed on a top surface 135 of pad oxide layer 125. Trench 105 has a width W and a depth D (where D is measured from top surface 110 of substrate 100). While W and D are functions of technology design groundrules which are ever decreasing, in one example W is about 100 nm to about 200 nm and D is about 6 microns to about 10 microns. In one example, pad oxide layer 125 comprises silicon oxide about 40 Å to about 130 Å thick and pad nitride layer 130 comprises silicon nitride about 1500 Å to about 2500 Å thick In FIG. 2, a silicon oxide layer 140 is formed on sidewalls 115 and bottom 120 of trench 105, a silicon nitride layer 145 is formed on silicon oxide layer 140 and pad nitride layer 130, and a polysilicon layer 150 is formed on silicon nitride layer 145. Silicon oxide layer 140 may be formed by thermal oxidation of a layer of substrate 100 on sidewalls 115 and bottom 120 of trench 105 after trench 105 has been formed. Alternatively, silicon oxide layer 140 may be formed by any number of methods, such as chemical-vapor deposition (CVD), low-pressure chemical-vapor deposition (LPCVD) and plasma enhanced chemical-vapor deposition (PECVD) known in the art. Silicon nitride layer 145 and polysilicon layer 150 are conformal coatings and may be formed by any number of methods, such as CVD, LPCVD and PECVD known in the art. In one example, silicon oxide layer 140 is about 30 Å to about 100 Å thick, silicon nitride layer 145 is about 40 Å to about 150 Å thick and polysilicon layer 150 is about 200 Å to about 500 Å thick.

Figure 3:
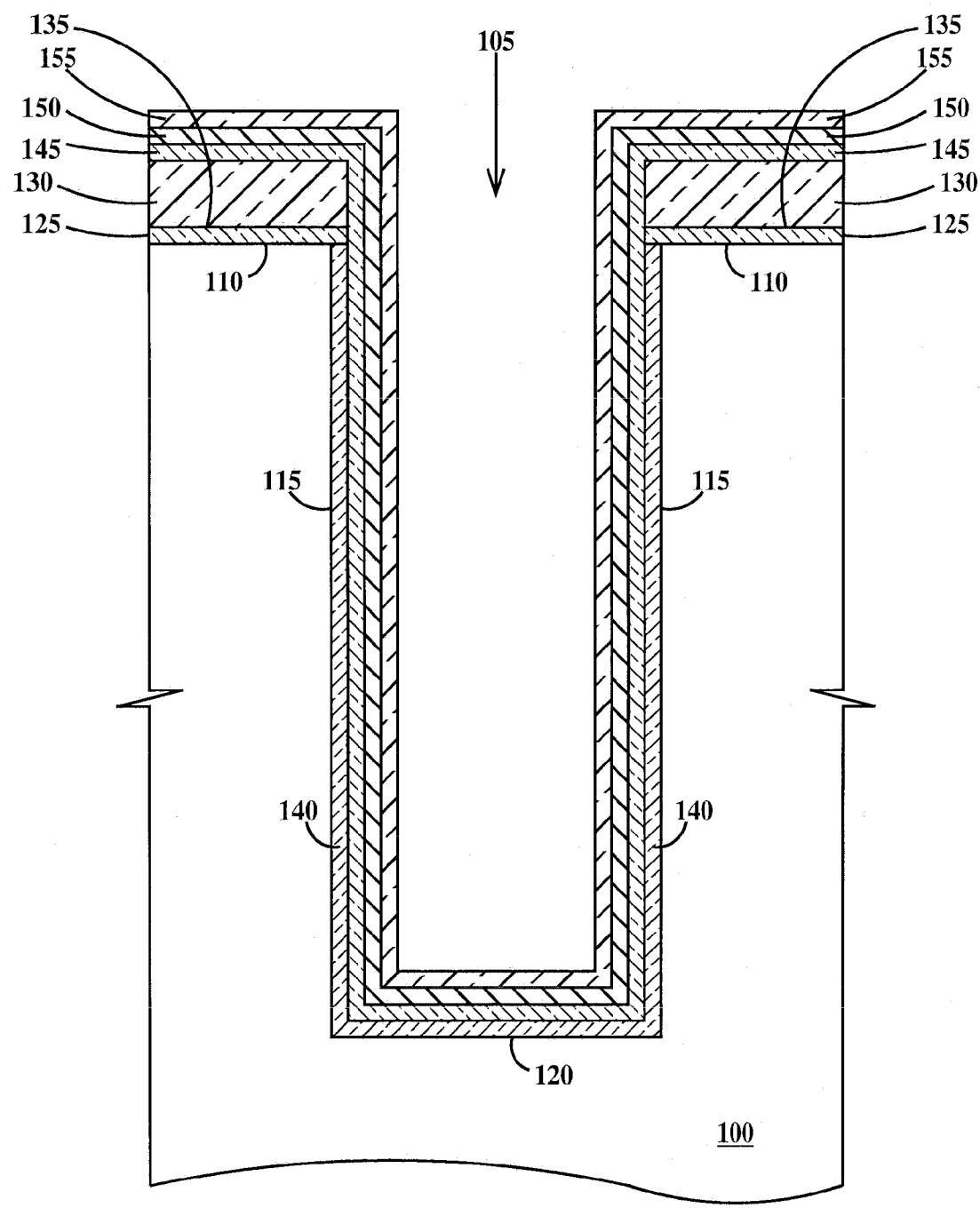

In FIG. 3, a high temperature oxidation is performed to convert an outer layer of polysilicon layer 150 to a silicon oxide layer 155. In one example, silicon oxide layer 155 is formed by thermal oxidation in dry oxygen at a temperature of about 1000° C. and is about 100 Å to about 500 Å thick. Alternatively, silicon oxide layer 155 may be formed by a conformal deposition process such as LPCVD.

Figure 4:
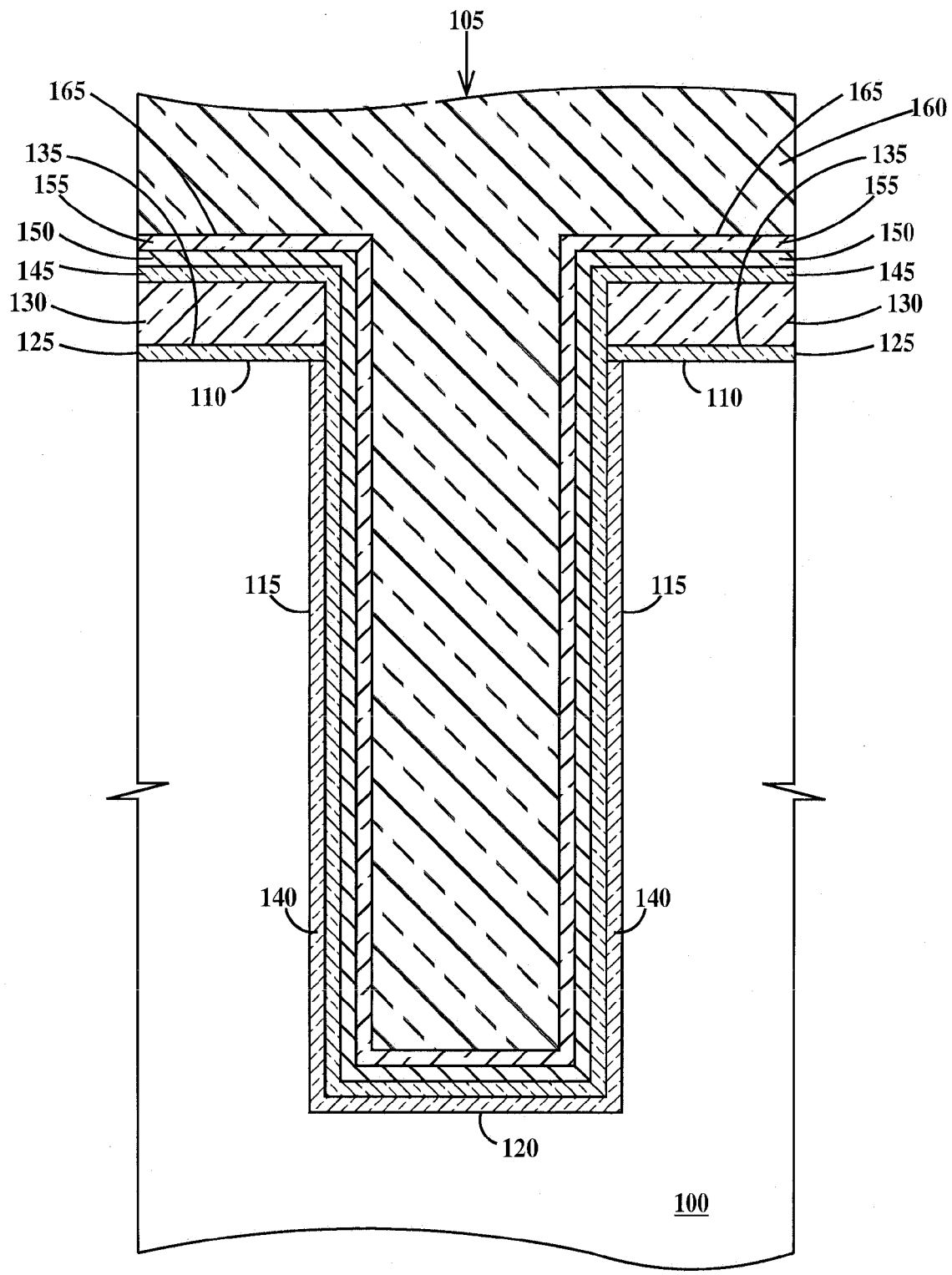

In FIG. 4, a photoresist layer 160 is formed over a top surface 165 of silicon oxide layer 150. Photoresist layer 160 fills trench 105. Other organic materials may be substituted for photoresist.

Figure 5:
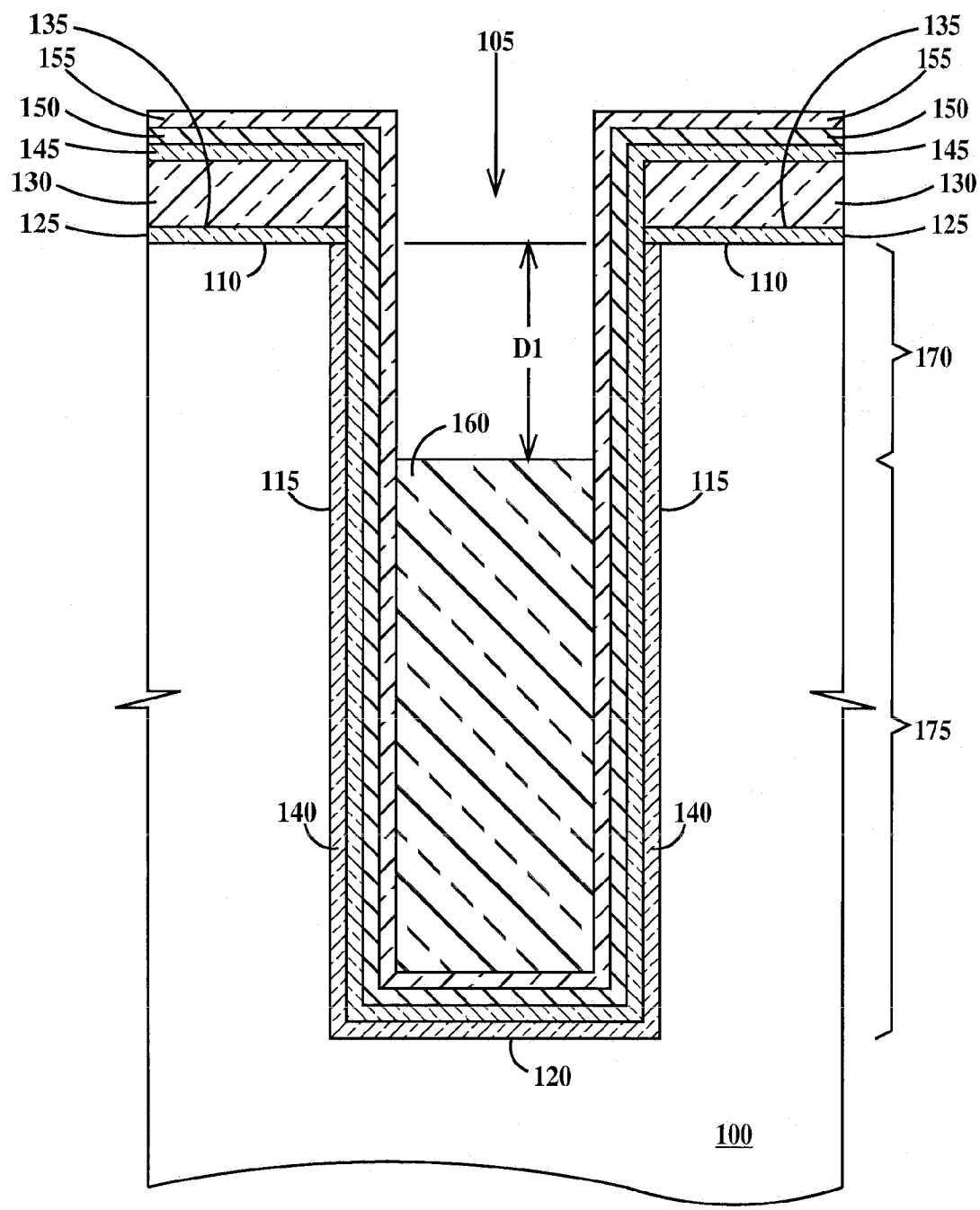

In FIG. 5, resist layer 160 is recessed to a depth D1 measured from top surface 110 of silicon substrate 100. Depth D1 defines an upper region 170 and a lower region 175 of trench 105. Depth D1 may be selected to correspond to be below the bottom of a P-well formed in an upper region of substrate 100 in which an N-channel field effect transistor (NFET) of a DRAM memory cell will be formed (see FIG. 15). In the case of a DRAM cell utilizing a buried strap, D1 defines the depth of a region where a collar oxide will be formed adjacent to the buried strap, the buried strap connecting the source of the NFET to the polysilicon plate of the capacitor (see FIG. 15). The collar oxide will isolate all or an upper portion of upper region 170 from the NFET of a DRAM memory cell. In one example D1 is about 1.0 microns to about 2.0 microns. Resist layer 160 may be recessed by any number of RIE processes well known in the art that do not etch silicon oxide.

Figure 6:
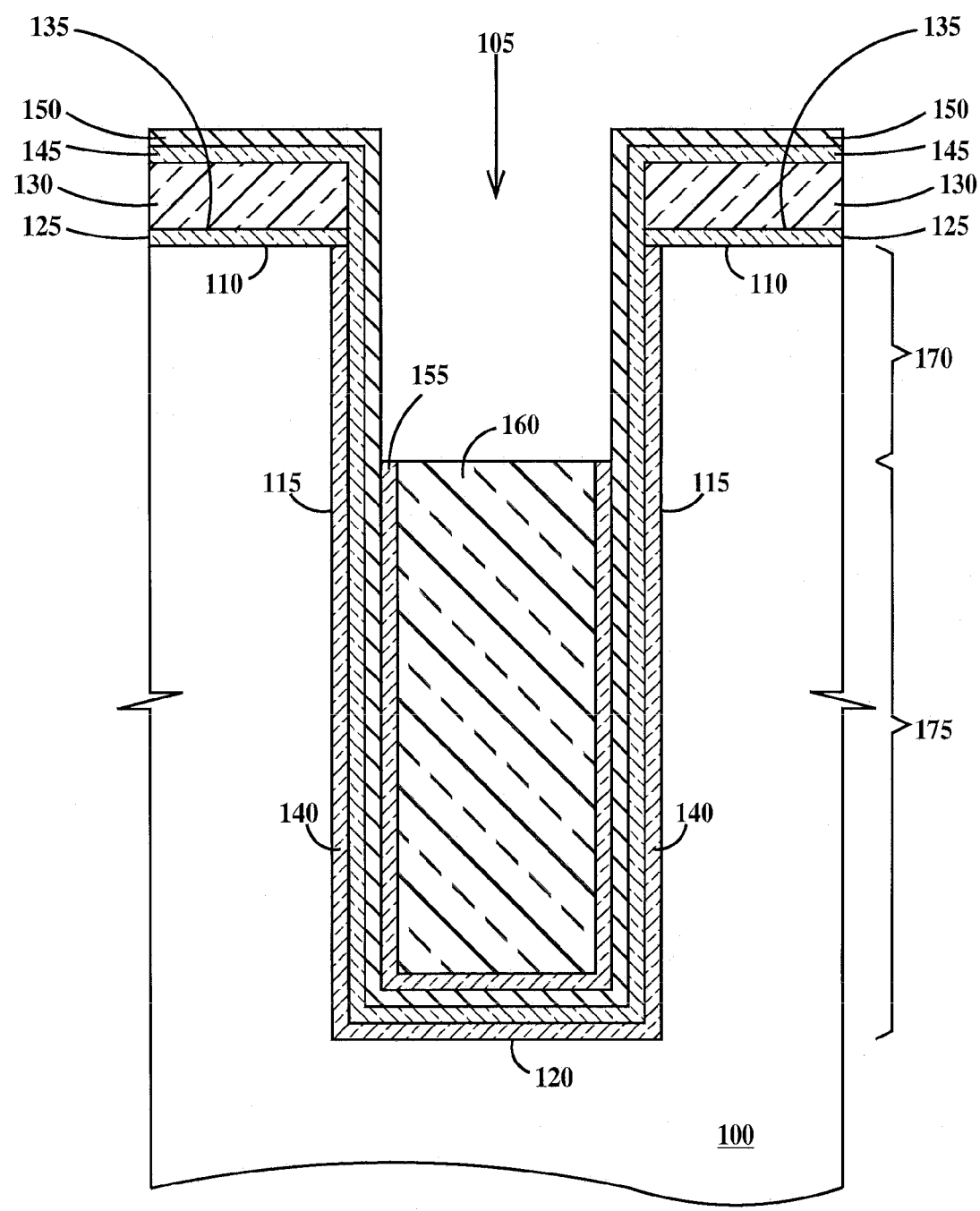

In FIG. 6, a portion of silicon oxide layer 155, not covered by resist layer 160 is removed, for example, using buffered HF or by chemical downstream etch (CDE) or other plasma based etching process, thus exposing polysilicon layer 150 in upper region 170 of trench 105.

Figure 7:
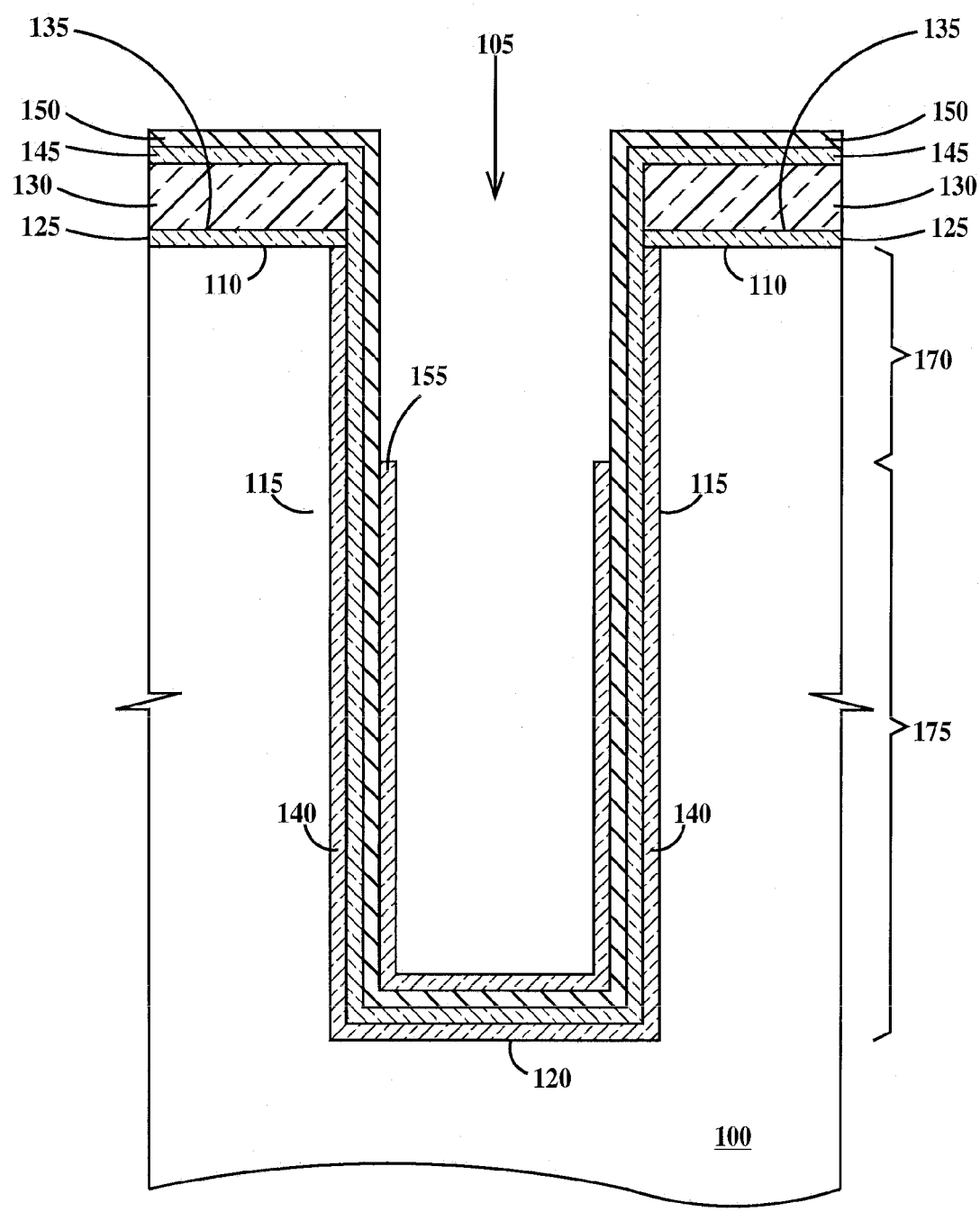

In FIG. 7, resist layer 160 (see FIG. 6) is removed, for example, using Huang cleans (aqueous mixtures of $H_2SO_4$ and $H_2O_2$ and $NH_4OH$ and $H_2O_2$) followed by an SC-2 clean (aqueous HCl).

Figure 8:
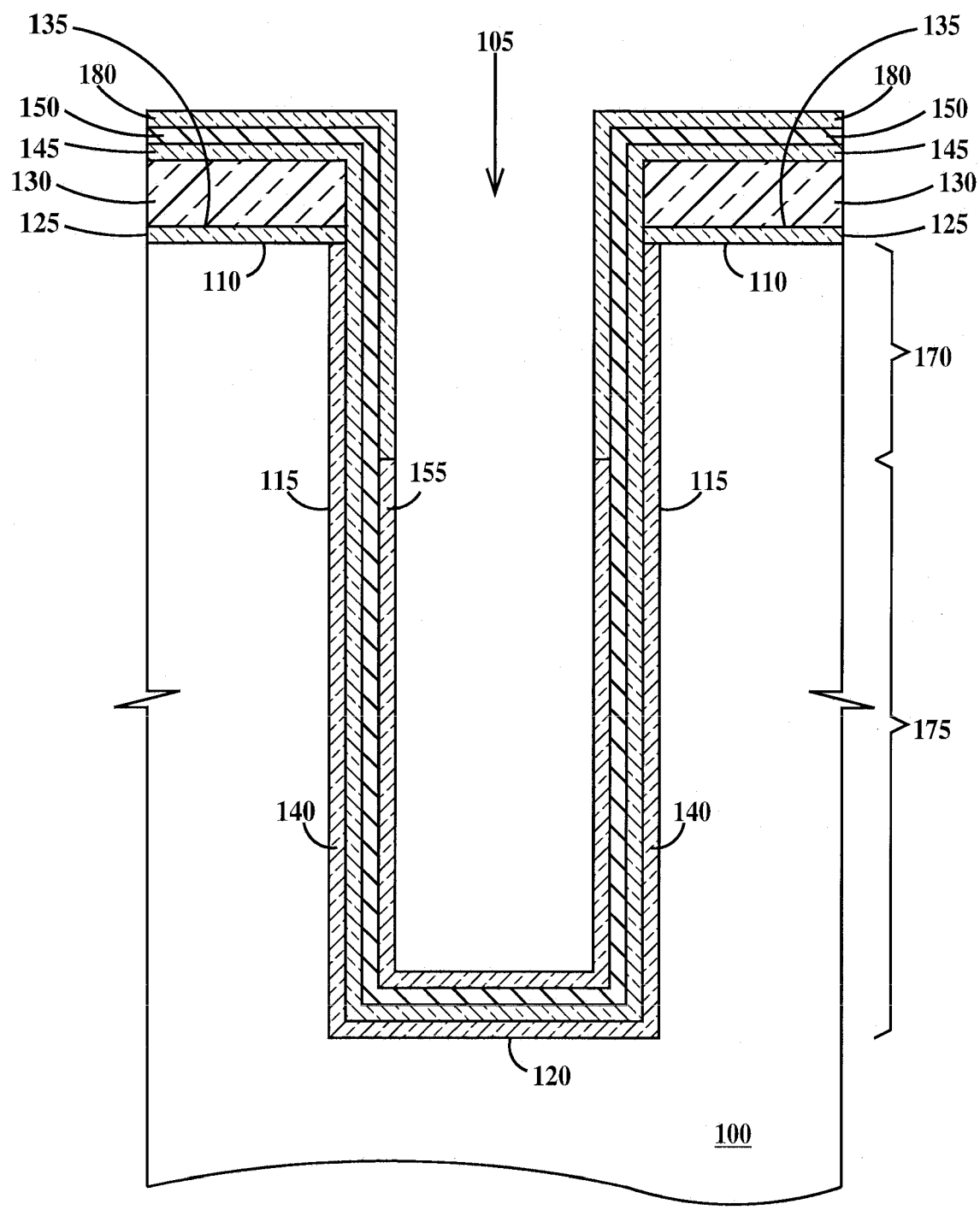

In FIG. 8, a plasma nitridation process using, for example, using $NH_3$, NO, $N_2O$ or $HNO_3$ gas is performed in order to convert an outer layer of polysilicon layer 150 to a silicon nitride layer 180 where polysilicon layer 150 is not covered by silicon oxide layer 155. Thus in trench 105, silicon nitride layer 180 is formed only in upper region 170. In one example, silicon nitride layer 180 is about 5 Å to about 50 Å thick.

Silicon oxide layer 140, silicon nitride layer 145, polysilicon layer 150 and silicon nitride layer 180 act as protective layers protecting sidewalls 115 of upper region 170 of trench 105 during subsequent processing steps that form a bottle region in silicon substrate as described infra.

Figure 9:
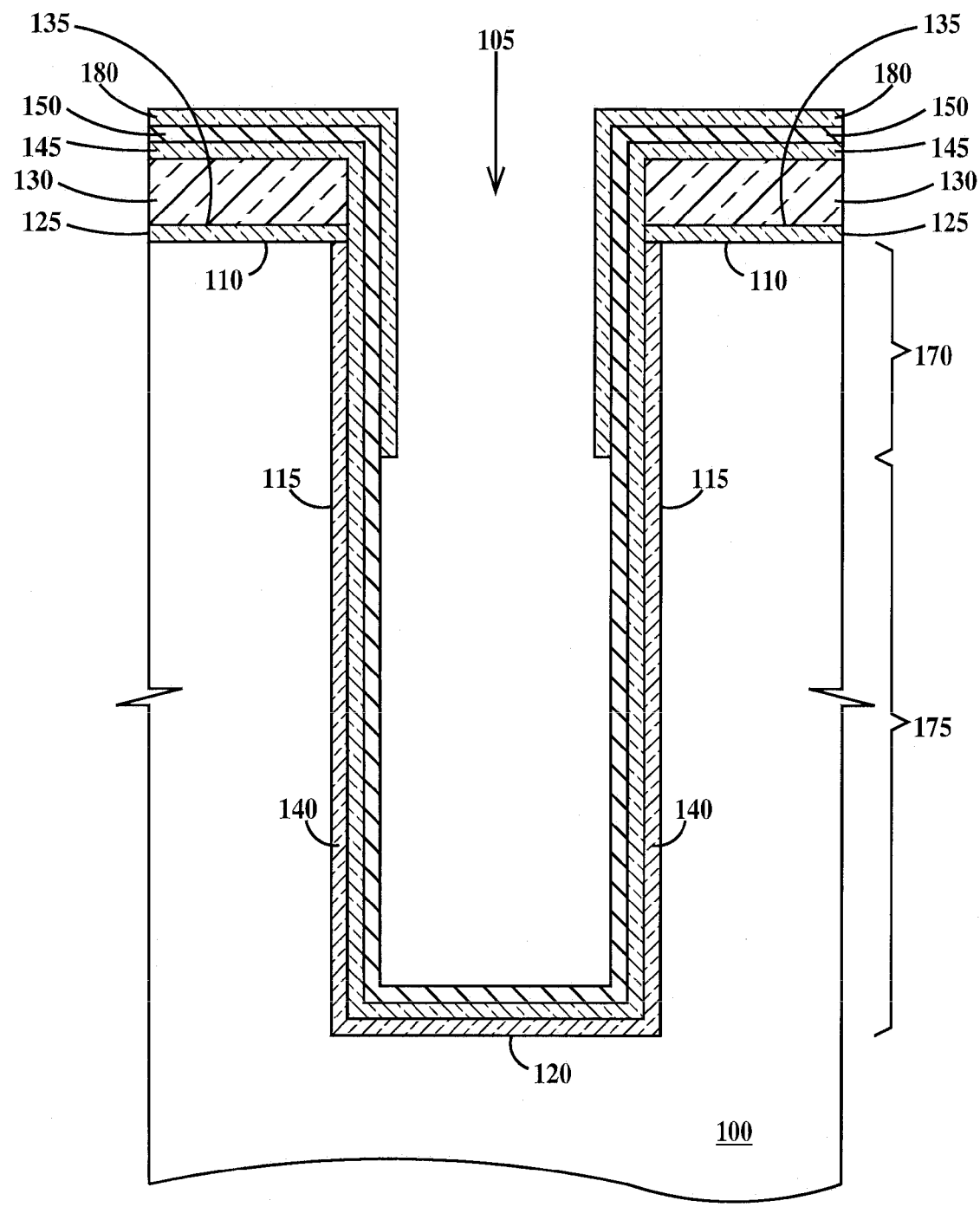

In FIG. 9, silicon oxide layer 155 (see FIG. 8) is removed using, for example, dilute HF, from lower region 175 of trench 105 and thus exposing polysilicon layer 150 in the lower region.

Figure 10:
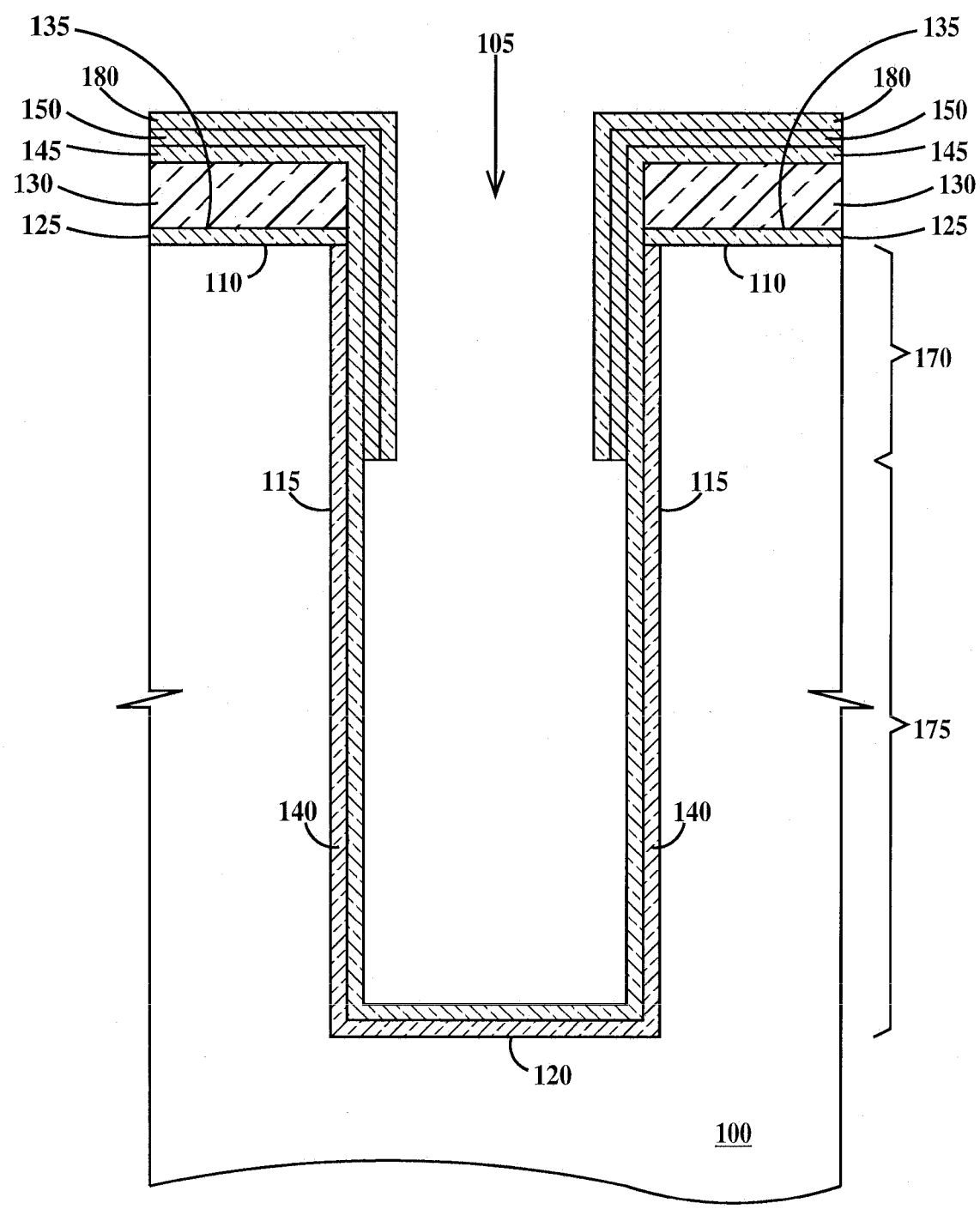

In FIG. 10, polysilicon layer 150 is removed in lower region 175 of trench 105 using for example, a three step process of first dilute HF etch, followed by an aqueous solution of $HN_3$ and $H_2O_2$ at a temperature between about 50° C. and about 80° C. followed by a second dilute HF etch thus exposing silicon nitride layer 145 in the lower region. Polysilicon layer 150 is not removed from upper region 170 because the polysilicon layer in the upper region is covered by silicon nitride layer 180.

Figure 11:
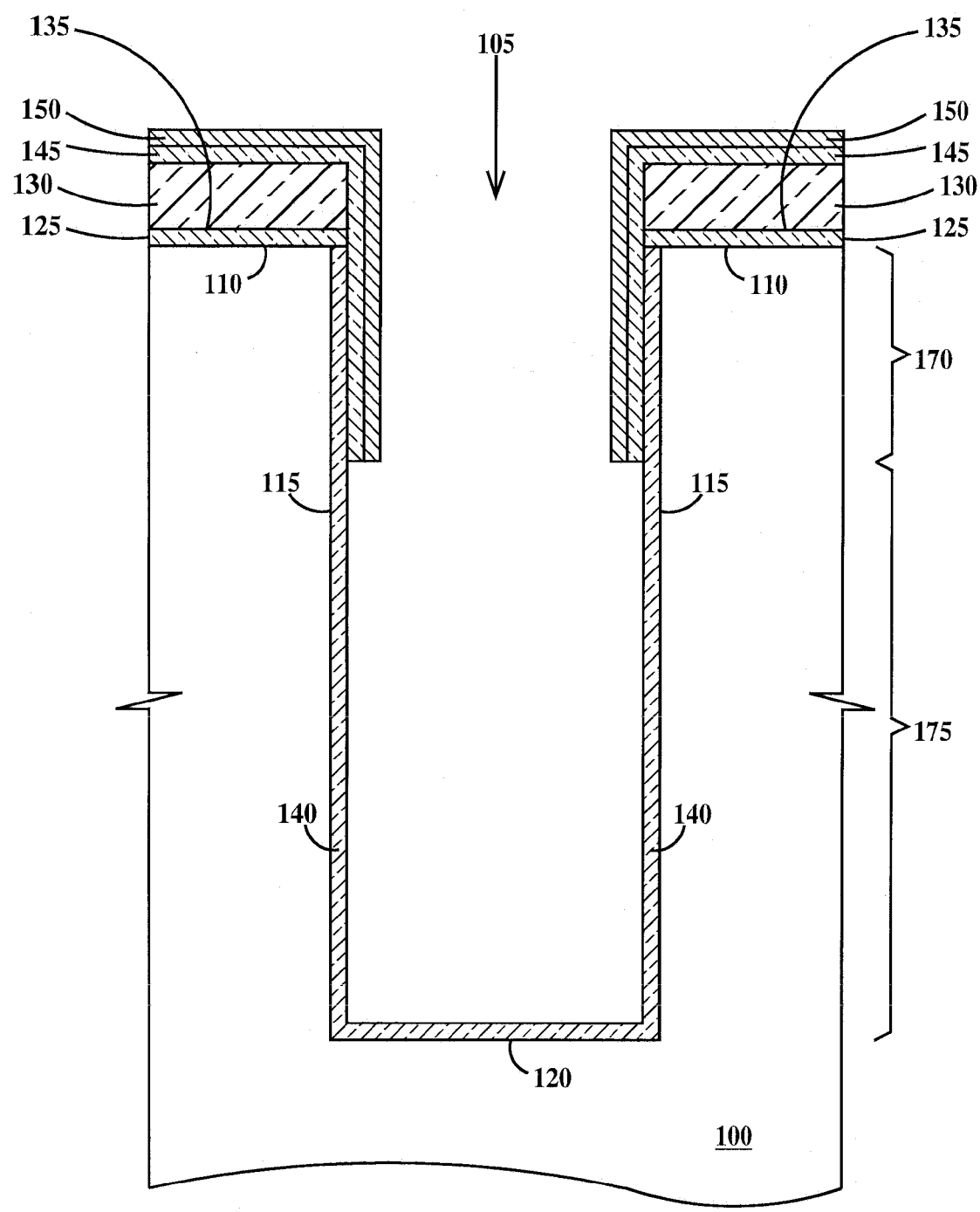

In FIG. 11, silicon nitride layer 145 is removed in lower region 175 of trench 105, for example, by a CDE or other plasma based etching process selective silicon nitride to silicon oxide thus exposing silicon oxide layer 140 in the lower region. Silicon nitride layer 145 is not removed from upper region 170 because silicon nitride layer 145 in the upper region is covered by polysilicon layer 150. All of remaining silicon nitride layer 180 (see FIG. 10) is also removed thus exposing polysilicon layer 150 in upper region 170.

Figure 12:
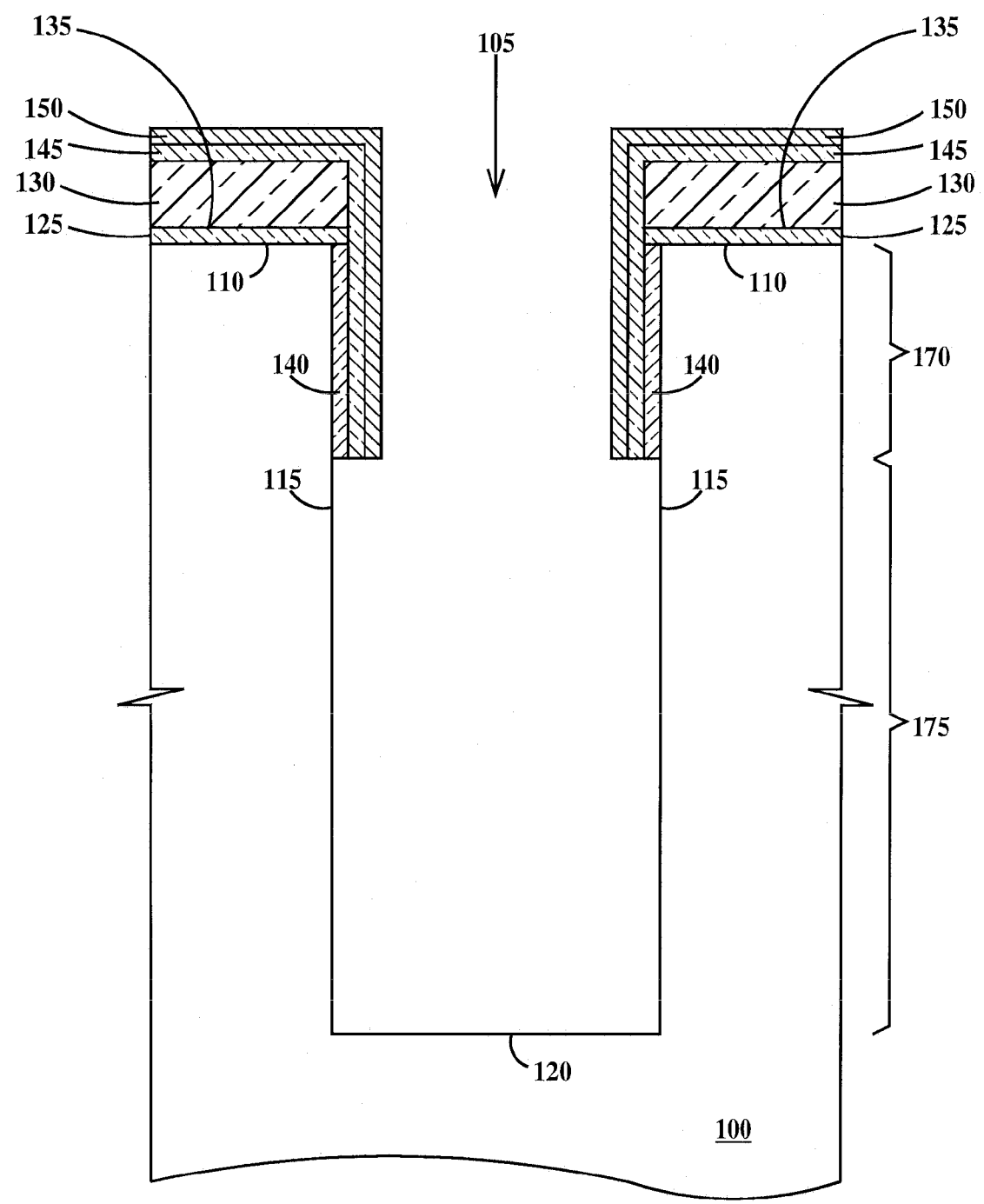

In FIG. 12, silicon oxide layer 140 is removed in lower region 175 of trench 105 using, for example, aqueous dilute HF thus exposing sidewalls 115 and bottom 120 of trench 105 in the lower region. Silicon oxide layer 140 is not removed from upper region 170 because silicon oxide layer 140 in the upper region is covered by silicon nitride layer 145 and polysilicon layer 150.

Figure 13:
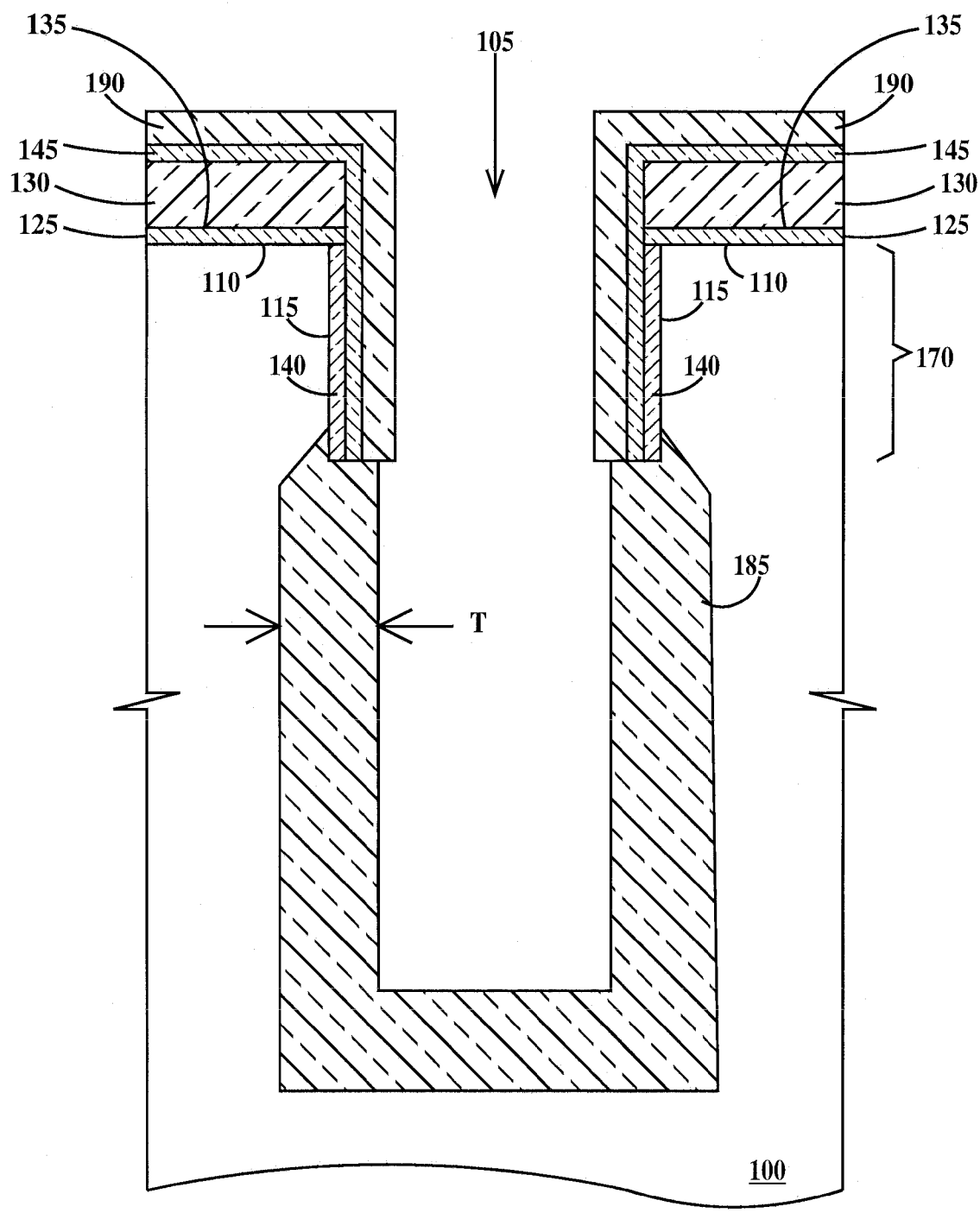

In FIG. 13, a thermal oxidation step is performed forming oxide layer 185 on all exposed surfaces of trench 105 and converting polysilicon layer 150 (see FIG. 12) in upper region 170 to a silicon oxide layer 190. Sidewalls 115 of trench 105 in upper region 170 are not oxidized because of the protection afforded by silicon nitride layer 145. In one example, the thermal oxidation step is performed in a furnace using dry oxygen at a temperature of about 1000° C. Wet oxidation (using $H_2O$ or a mixture of $H_2O$ and $O_2$) at a temperature of about 800° C. may be used as well. In one example, a thickness T of silicon oxide layer 185 is about ¼ the width W or greater (see FIG. 1) of trench 105. The thickness T is a function of the length of time of the thermal oxidation.

Figure 14:
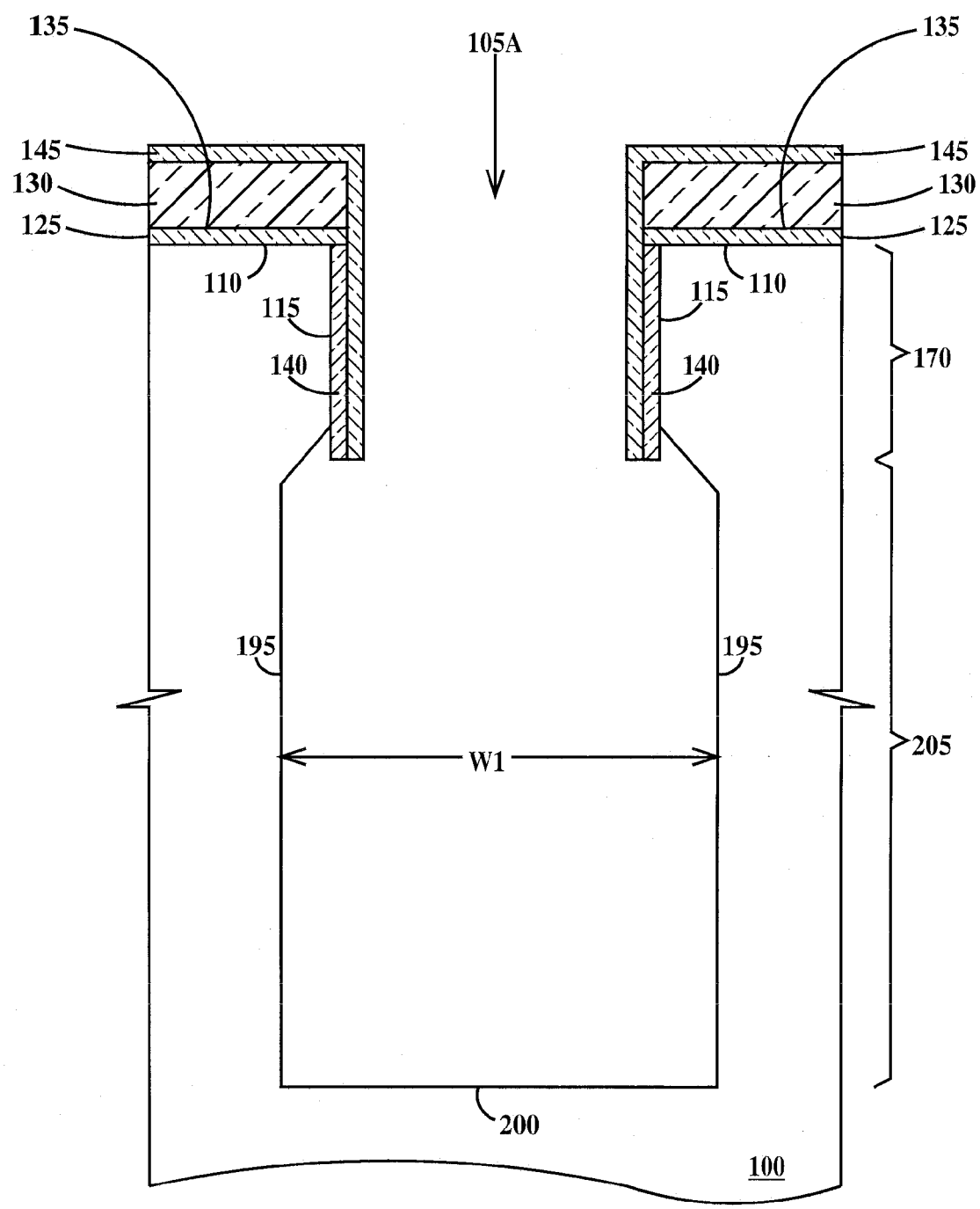

In FIG. 14 silicon oxide layers 185 and 190 (see FIG. 13) are removed, for example using dilute aqueous HF creating sidewalls 195 and bottom 200 of a bottle region 205 of trench 105 in what was lower region 175 (see FIG. 13). Trench 105 of FIG. 13 is now trench 105A of FIG. 14 and has an approximate "bottle" shape, with upper region 170 being the "neck" of the "bottle." Another way of describing the geometry of trench 105A is that a cross-sectional area of lower region 175 of trench 105A is greater than a cross-sectional area of upper region 170 of trench 105A. Bottle region 205 has a width W1. While it may be desirable for width W1 to be large, for example, to increase capacitance by increasing the surface area of sidewalls 115 and bottom 120, the maximum value of width W1 is constrained by the spacing between adjacent trenches 105A in an integrated circuit chip. Adjacent trenches cannot be allowed to contact. In one example W1 is about equal to 1.5 times W to about 2 times W (see FIG. 1).

Note no silicon etching was performed in formation of bottle region 205. The use of silicon etchants can lead to various defects during formation of the "bottle" because of pinholes in protective layers may allow etching of silicon in sidewalls 115 of upper region 170 and because silicon etchants can cause sidewalls 195 of bottle region 205 to be rough. Either of these types of defects can adversely affect processing yield, reliability and DRAM performance.

Figure 15:
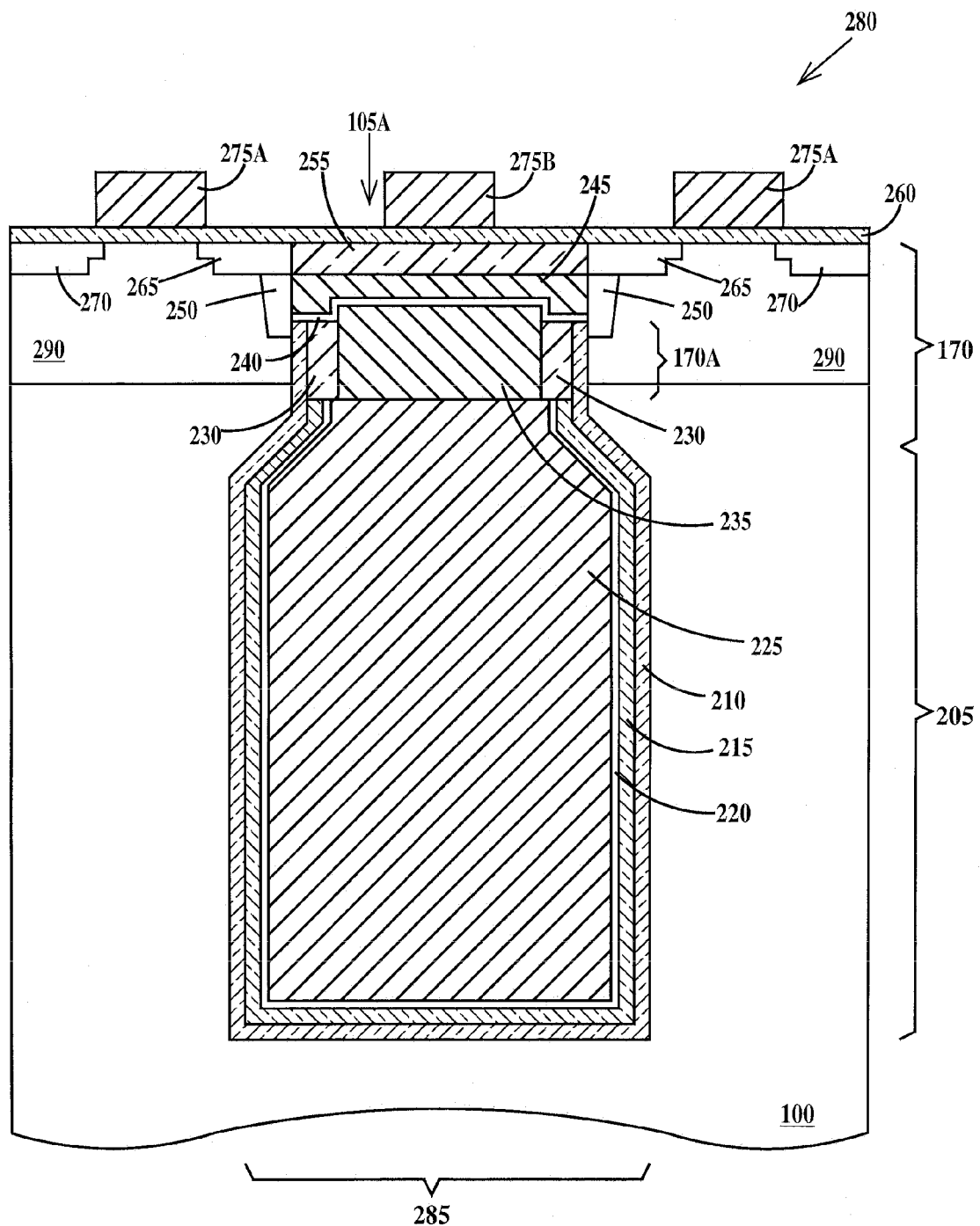
FIG. 15, is a cross-sectional view of a DRAM cell using a bottle trench capacitor, the bottle region of which was formed according to the present invention.

In FIG. 15, is a cross-sectional view of a DRAM cell using a bottle trench capacitor, the bottle region of which was formed according to the present invention. In FIG. 15, silicon nitride layer 145 and silicon oxide layer 140 on sidewalls 115 of upper region 170 were removed using appropriate wet etching processes. After removing the silicon nitride layer 145 and silicon oxide layer 140, a DRAM cell was completed as described briefly infra.

A silicon oxide layer 210 was formed on exposed silicon surfaces in trench 105A and a node nitride layer 215 was formed on silicon oxide layer using, for example, an LPCVD process. An oxy-nitride layer 220 was formed on node silicon nitride layer 215 using, for example, a thermal oxidation process. An N-doped first polysilicon layer 225 was deposited in trench 105A using, for example, an LPCVD process. First polysilicon layer 225 was removed from upper portion 170A of upper region 170 using, for example, an isotropic etch process. Node nitride layer 215 and oxy-nitride layer 220 were removed from upper portion 170A from of upper region 170 using, for example, a mixture of HF and ethylene glycol.

A collar oxide layer 230 was formed in upper portion 170A of upper region 170 using, for example, an LPCVD process. An N-doped second polysilicon layer 235 was deposited in upper portion 170A of upper region 170 using, for example, an LPCVD process and then etched back using, for example, a RIE process. Collar oxide layer 230 exposed above second polysilicon layer 235 was removed using for example, a wet etching process.

A plasma nitridation process was performed to form a nitrided layer 240 for variable retention time control. An N-doped third polysilicon layer 245 was deposited using, for example, an LPCVD process and a buried strap 250 was formed by out-diffusion of dopant (in one example arsenic) from third polysilicon layer 2450. Third polysilicon layer 245 was etched back using, for example, an RIE process, and a thick oxide layer 255 formed using, for example an LPCVD or PECVD process.

Shallow trench isolation (STI) (not shown) was formed, pad oxide layer 125 and pad nitride layer 130 removed and then a gate dielectric layer 260 was formed. Sources 265 and drains 270 were formed using spacer, extension implantation and source/drain ion implantation processes and gate electrodes 275A and 275B formed using, for example polysilicon LPCVD and RIE processes. Gate electrodes 275A are wordlines (WLs) of a DRAM cell 280 and gate electrode 275B is a passing wordline going to other DRAM cells.

First, second and third polysilicon layers 225, 235 and 240 are examples of an electrically conductive material that may be used to fill trench 105A and act as a first plate of bottle trench capacitor 285. Many other combinations of dielectric layers and electrically conductive plate materials and methods of forming the dielectric layer and plates known in the may be substituted.

In the case that bottle trench capacitor 285 is used in an NFET gated DRAM cell, a P-well region 290 of substrate 100 is illustrated in approximate position relative to upper region 170. P-well region 285 may be formed after formation of bottle trench capacitor 280 or prior to formation of trench 105 (see FIG. 14).

Therefore, the present invention provides a bottle trench capacitor process with reduced susceptibility to process defects and merging of adjacent trenches during formation of the bottle portion of the capacitor.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) providing a substrate;
   (b) forming a trench in said substrate, said trench having sidewalls and a bottom, said trench having an upper region adjacent to a top surface of said substrate and a lower region adjacent to said bottom of said trench, said upper region abutting said lower region;
   (c) forming a protective layer on said sidewalls and said bottom of said trench, said protective layer comprising a first layer on said sidewalls and bottom of said trench, a second layer on said first layer and a third layer on said second layer;
   (d) removing said protective layer from said sidewalls in said lower region of said trench and from said bottom of said trench, said first, second and third layers of said protective layer remaining over said sidewalls of said trench in said upper region after said removing said protective layer from said sidewalls in said lower region of said trench and from said bottom of said trench;
   (e) oxidizing a layer of said substrate exposed in step (d) on said sidewalls in said lower region of said trench and on said bottom of said trench; and
   (f) removing said layer of said substrate oxidized in step (e) from said lower region of said trench.

2. The method of claim 1, further including:
   (g) forming one or more dielectric layers on surfaces of said substrate exposed in said lower region of said trench in step (f); and
   (h) filling said trench with a electrically conductive material.

3. The method of claim 2, step (g) further including forming said one or more dielectric layers on said sidewalls of said trench in said upper region of said trench.

4. The method of claim 2, wherein said electrically conductive material is N-doped, P-doped or undoped polysilicon.

5. The method of claim 1, wherein after step (f), a cross-sectional area of said lower region of said trench is greater than a cross-sectional area of said upper region of said trench.

6. The method of claim 1, wherein said substrate is a silicon substrate or a layer of silicon on a silicon-on-insulator substrate and said oxidized layer of substrate comprises silicon oxide.

7. The method of claim 1, wherein said third layer comprises polysilicon, said second layer comprises silicon nitride and said third layer comprises silicon oxide.

8. The method of claim 1, step (d) further including removing said third layer from sidewalls of said upper region of said trench after forming said oxidized layer of substrate in said bottom region of said trench.

* * * * *